(12) United States Patent
Park et al.

(10) Patent No.: US 12,300,435 B2
(45) Date of Patent: May 13, 2025

(54) CAPACITOR MODULE, POWER CONVERSION DEVICE, AND MOTOR ASSEMBLY INCLUDING SAME

(71) Applicants: Hyundai Motor Company, Seoul (KR); Kia Corporation, Seoul (KR)

(72) Inventors: Hyong Joon Park, Hwaseong-si (KR); Ju Man Yoon, Seoul (KR); Seul Bee Lee, Seoul (KR); Ju Hee Kim, Chungcheongnam-do (KR); Ok Geun Ha, Hwaseong-si (KR); Se Heun Kwon, Incheon (KR); Sung Jun Yoon, Suwon-si (KR); Sang Hoon Lee, Taebaek-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 465 days.

(21) Appl. No.: 17/695,386

(22) Filed: Mar. 15, 2022

(65) Prior Publication Data
US 2022/0384106 A1 Dec. 1, 2022

(30) Foreign Application Priority Data
Jun. 1, 2021 (KR) .................. 10-2021-0071060

(51) Int. Cl.
*H05K 7/20* (2006.01)
*H01G 2/08* (2006.01)
(Continued)

(52) U.S. Cl.
CPC .................. *H01G 2/08* (2013.01); *H01G 2/10* (2013.01); *H02M 7/003* (2013.01);
(Continued)

(58) Field of Classification Search
CPC ........... H01G 2/08; H01G 2/10; H02M 7/003; H05K 7/20872; H05K 7/20927;
(Continued)

(56) References Cited

U.S. PATENT DOCUMENTS

| 2006/0050483 A1* | 3/2006 | Wilson | .................. H01L 23/473 361/689 |
| 2013/0220587 A1* | 8/2013 | Tamura | .................. F28F 3/022 165/185 |

(Continued)

FOREIGN PATENT DOCUMENTS

| KR | 10-2018-0057411 A | 5/2018 |
| KR | 10-2021-0110655 A | 9/2021 |
| KR | 10-2023-0028851 A | 3/2023 |

*Primary Examiner* — Jacob R Crum
(74) *Attorney, Agent, or Firm* — Morgan, Lewis & Bockius LLP

(57) ABSTRACT

The present disclosure provides a capacitor module including: a capacitor; a first housing having a hexahedron shape and having an inner space in which the capacitor is disposed, the first housing including a pair of cooling parts recessed inwards from a pair of parallel surfaces among outer side surfaces thereof such that a refrigerant flows, a pair of cooling channels disposed inside opposite side surfaces perpendicular to the surfaces of the pair of cooling parts such that the pair of cooling parts communicate with each other, and a through-hole configured to connect each of the cooling channels to the outside such that the refrigerant is introduced or discharged therethrough; and a cooling plate coupled to the first housing so as to seal the cooling parts.

6 Claims, 9 Drawing Sheets

(51) Int. Cl.
*H01G 2/10* (2006.01)
*H02M 7/00* (2006.01)

(52) U.S. Cl.
CPC ..... *H05K 7/20254* (2013.01); *H05K 7/20872* (2013.01); *H05K 7/20927* (2013.01)

(58) Field of Classification Search
CPC .... H05K 5/0217; H05K 7/2089; H05K 7/209; H05K 7/20254
See application file for complete search history.

(56) References Cited

U.S. PATENT DOCUMENTS

2017/0055378 A1* 2/2017 Zhou .................. H05K 7/20927
2018/0145605 A1* 5/2018 Park ........................ B60L 3/003
2019/0343019 A1* 11/2019 Todorovic .......... H05K 7/20927

* cited by examiner

CAPACITOR MODULE, POWER CONVERSION DEVICE, AND MOTOR ASSEMBLY INCLUDING SAME

CROSS REFERENCE TO RELATED APPLICATION

The present application claims priority to Korean Patent Application No. 10-2021-0071060, filed Jun. 1, 2021, the entire contents of which is incorporated herein for all purposes by this reference.

TECHNICAL FIELD

The present disclosure relates to a power conversion device and, more particularly, to a power conversion device including multiple capacitor modules and power modules.

BACKGROUND

In line with recent attention to green energy, hybrid cars, electric cars, fuel-cell electric cars, and the like have been drawing attention as future cars to replace internal combustion engine cars.

Such hybrid cars and electric/fuel-cell electric cars use engines and high-output motors as power sources.

In addition, hybrid cars and electric/fuel-cell electric cars employ inverter systems for converting high-voltage DC power generated by batteries or fuel cells into three-phase (U, V, W) AC power, in order to charge/discharge internally produced electric energy.

An inverter system includes a power module including an insulated gate bipolar transistor (IGBT), and a capacitor module for absorbing ripple currents caused by switching of a power semiconductor switching element of the power module.

Such a capacitor module is electrically connected, through a busbar, to the input terminal of the inverter (high-voltage DC input terminal) and the power module.

Meanwhile, the most critical factor in connection with inverter power module design is the cooling structure, because the cooling performance may determine the output performance.

Therefore, there is a need for an inverter unit including a power module, a capacitor, a busbar, and a cooling-water channel configured as a single package, thereby improving the cooling efficiency, and having a reduced size, thereby satisfying various specification requirements.

The above descriptions regarding background technologies have been made only to help understanding of the background of the present disclosure, and are not to be deemed by those skilled in the art to correspond to already-known prior arts.

SUMMARY

The present disclosure has been proposed to solve the above-mentioned problems, and it is an aspect of the present disclosure to provide a modularized power conversion device including multiple capacitor modules and power modules, thereby improving the cooling efficiency.

A power conversion device for a vehicle according to the present disclosure includes: a capacitor; a first housing having an inner space in which the capacitor is disposed, the first housing including a pair of cooling parts recessed inwards from a pair of parallel surfaces among outer side surfaces thereof such that a refrigerant flows, a pair of cooling channels disposed inside opposite side surfaces perpendicular to the surfaces of the pair of cooling parts such that the pair of cooling parts communicate with each other, and a through-hole configured to connect each of the cooling channels to the outside such that the refrigerant is introduced or discharged therethrough; and a cooling plate coupled to the first housing so as to seal the cooling parts.

The inner space of the first housing may have an open upper portion configured to allow the capacitor to be inserted through the upper portion of the first housing to the inner space.

The capacitor may include electrodes extending upwards and configured to be electrically connectable.

The cooling plate may include one or more cooling fins extending into the cooling part to be in contact with the refrigerant.

The power conversion device for a vehicle may further include a nipple connected to the through-hole and extending to the outside of the first housing such that the refrigerant is introduced from the outside or discharged to the outside.

The first housing may have a hexahedron shape.

A power conversion device according to the present disclosure includes a capacitor module and a power module. The capacitor module includes: a capacitor; a first housing having an inner space in which the capacitor is disposed, the first housing including a pair of first cooling parts recessed inwards from a pair of parallel surfaces among the outer side surfaces thereof such that a refrigerant flows, a pair of cooling channels disposed inside opposite side surfaces perpendicular to the surfaces of the pair of first cooling parts such that the pair of first cooling parts communicate with each other, and a first through-hole configured to connect each of the cooling channels to the outside such that the refrigerant is introduced or discharged therethrough; and a first cooling plate coupled to the first housing so as to seal the first cooling parts. The power module has one side surface in surface contact with the first cooling plate.

The capacitor module may include a bracket configured to couple the power module to one side surface thereof such that the power module is in contact with the cooling plate.

The plurality of capacitor modules and power modules may be alternately stacked to each other in a coupling direction thereof.

The first through-hole may be provided through the outer side surface of the first housing, the capacitor module may further include a first nipple which is connected to the first through-hole and through which the refrigerant is injected, and the first nipple may be configured to connect the first through-holes of two adjacent capacitor modules.

The power conversion device may further include: a dummy module including a second housing including a second cooling part such that the refrigerant flows, and a second through-hole configured to connect the second cooling part to the outside such that the refrigerant is introduced or discharged therethrough, and a second cooling plate configured to seal the second cooling part. The dummy module may be connected such that the second cooling plate is in surface contact with the other side surface of the power module.

The dummy module may include a second nipple connected to the second through-hole, and the second nipple may be connected to the first through-hole of the first housing adjacent thereto such that the refrigerant is introduced or discharged through the first through-hole of the first housing.

The power conversion device may further include: a positive DC busbar positioned on the capacitor module and the power module and configured to connect positive electrodes of the capacitor module and the power module to a positive electrode of a battery; a negative DC busbar stacked on a first insulation plate and configured to connect negative electrodes of the capacitor module and the power module to a negative electrode of the battery; a control board positioned on the negative DC busbar and connected to the power module to control the power module; and insulation plates positioned beneath the positive DC busbar and under the negative DC busbar, respectively, to insulate the positive DC busbar and the negative DC bus from each other.

The power conversion device may further include a busbar assembly connected to the bottom of the power module to connect an external motor to the power module.

A motor assembly according to the present disclosure includes: a motor housing including a first mounting part which is disposed at a lower portion thereof and in which a motor is coupled, and a second mounting part which is disposed at an upper portion thereof and in which a power conversion device is disposed.

The motor assembly may further include a connector extending through the motor housing toward the second mounting part and connected to the first through-hole of the first housing such that the refrigerant is injected from the outside.

The motor housing may have an open upper side to allow a vehicle power conversion device to be inserted into the second mounting part from above, and may further include a support part disposed inside the second mounting part and configured to support the power conversion device mounted in the second mounting part.

The first housing may have a hexahedron shape.

A power conversion device according to the present disclosure is advantageous in that capacitor modules having cooling plates mounted on both side surfaces thereof are stacked alternately with power modules; dummy modules are coupled to the last part; the capacitor modules and the dummy modules are connected so as to communicate with each other such that a refrigerant flows; the multiple capacitors and the power modules can thus be cooled by injecting a refrigerant once; and the cooling plates on both sides of the power modules improve the power module cooling performance.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION OF THE EXEMPLARY EMBODIMENTS

Figure 1:
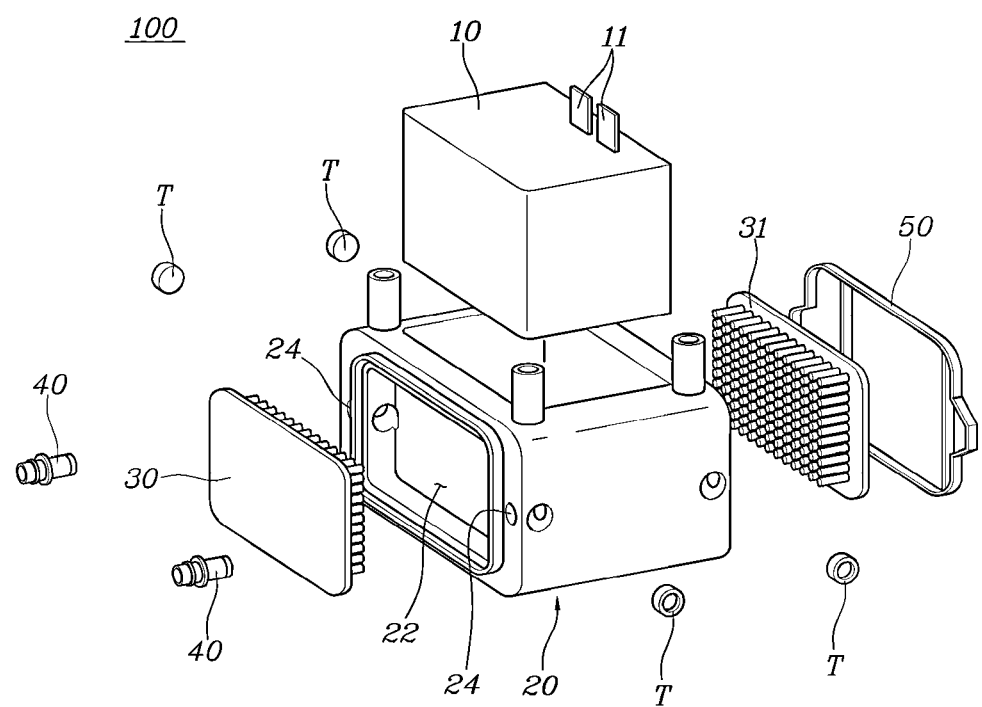
FIG. 1 is a perspective view of a capacitor module according to one embodiment of the present disclosure.

A specific structural or functional description of embodiments of the present disclosure disclosed in the specification or application is given merely for the purpose of describing the embodiment according to the present disclosure. Therefore, the embodiments according to the present disclosure may be implemented in various forms, and the present disclosure should not be construed as being limited to the embodiments described in the specification or application.

Various changes and modifications may be made to the embodiments according to the present disclosure, and therefore particular embodiments will be illustrated in the drawings and described in the specification or application. However, it should be understood that embodiments according to the concept of the present disclosure are not limited to the particular disclosed embodiments, but the present disclosure includes all modifications, equivalents, and alternatives falling within the spirit and scope of the present disclosure.

Such terms as "a first" and/or "a second" may be used to described various elements, but the elements should not be limited by these terms. These terms are intended merely to distinguish one element from other elements. For example, a first element may be named a second element and similarly a second element may be named a second element without departing from the scope of protection of the present disclosure.

In the case where an element is referred to as being "connected" or "accessed" to other elements, it should be understood that not only the element is directly connected or accessed to the other elements, but also another element may exist between them. Contrarily, in the case where a component is referred to as being "directly connected" or "directly accessed" to any other component, it should be understood that there is no component therebetween. The other expressions of describing a relation between structural elements, e.g., "between" and "merely between" or "neighboring" and "directly neighboring", should be interpreted similarly to the above description.

The terms used in the present disclosure are merely used to describe specific embodiments, and are not intended to limit the present disclosure. A singular expression may include a plural expression unless they are definitely different in a context. As used herein, the expression "include" or "have" are intended to specify the existence of mentioned features, numbers, steps, operations, elements, components, or combinations thereof, and should be construed as not precluding the possible existence or addition of one or more other features, numbers, steps, operations, elements, components, or combinations thereof.

Unless defined otherwise, all terms used herein, including technical and scientific terms, have the same meaning as those commonly understood by a person skilled in the art to which the present disclosure pertains. Such terms as those defined in a generally used dictionary may be interpreted to have the meanings equal to the contextual meanings in the relevant field of art, and are not to be interpreted to have ideal or excessively formal meanings unless clearly defined in the present disclosure.

Hereinafter, exemplary embodiments of the present disclosure will be described in detail with reference to the accompanying drawings. The same or like reference signs presented in the drawings designate the same or like elements.

Figure 2:
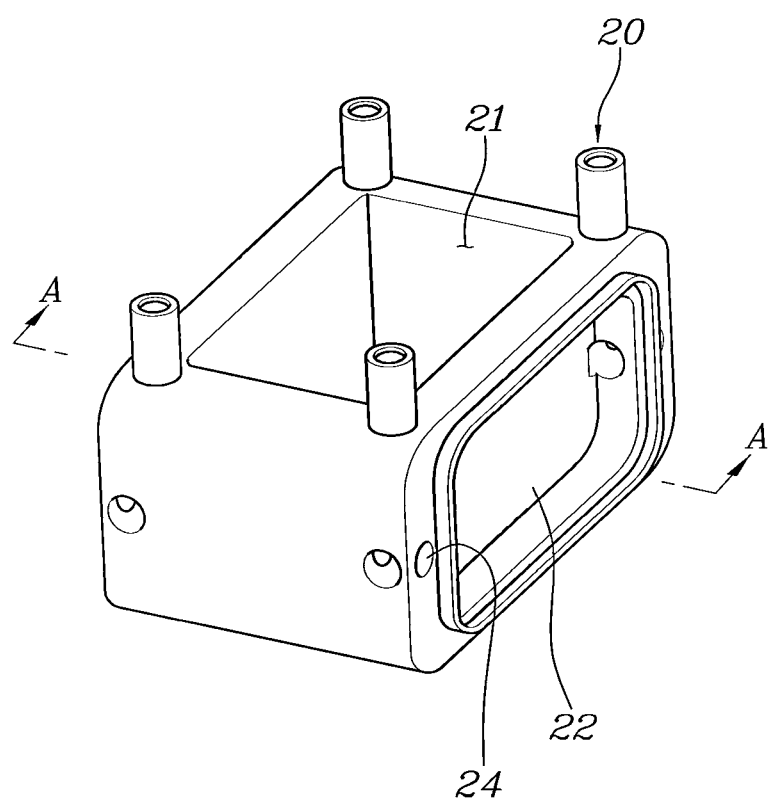
FIG. 2 is a rear view of a first housing according to one embodiment of the present disclosure.
Figure 3:
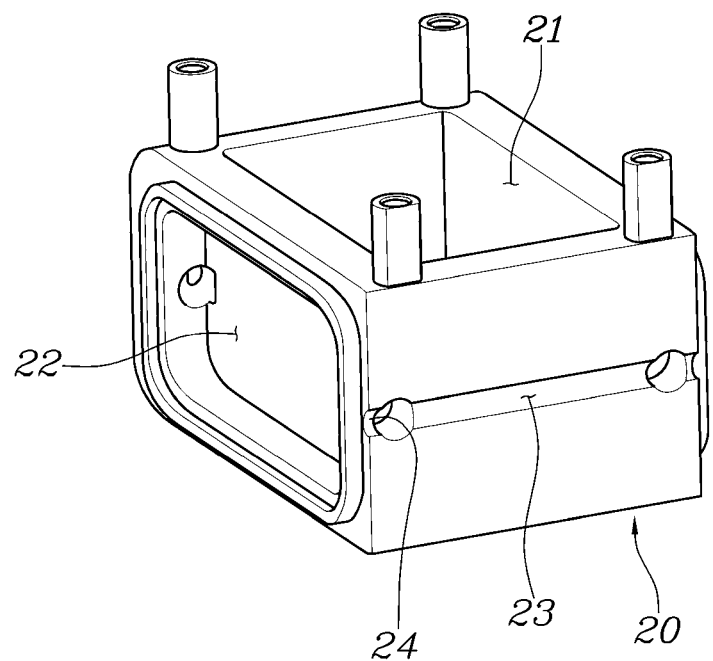
FIG. 3 is a perspective view of a first housing according to one embodiment of the present disclosure.
Figure 4:
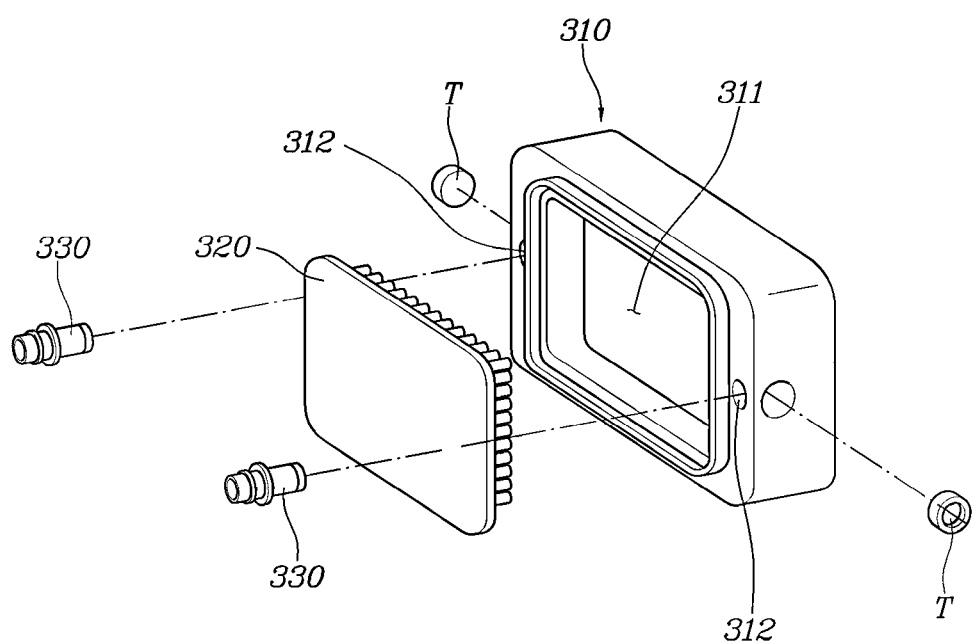
FIG. 4 is a perspective view of a dummy module according to one embodiment of the present disclosure.

FIG. 1 is a perspective view of a capacitor module 100 according to one embodiment of the present disclosure, FIG. 2 is a rear view of a first housing 20 according to one embodiment of the present disclosure, and FIG. 3 is a perspective view of a first housing 20 according to one embodiment of the present disclosure.

A preferred embodiment of the capacitor module 100 according to the present disclosure will be described with reference to FIGS. 1 to 3.

A vehicle power conversion device according to the present disclosure includes: a capacitor 10; a first housing 20 having a hexahedron shape and having an inner space 21 into which the capacitor 10 is inserted, the first housing 20 including a pair of cooling parts 22 recessed inwards from a pair of parallel surfaces among the outer side surfaces thereof such that a refrigerant flows, a pair of cooling channels 23 formed inside opposite side surfaces perpendicular to the surfaces of the pair of cooling parts 22 such that the pair of cooling parts 22 communicate with each other, and a through-hole 24 configured to connect the cooling channels 23 to the outside such that a refrigerant is introduced or discharged therethrough; and a cooling plate 30 coupled to the first housing 20 so as to seal the cooling parts 22.

As shown in FIG. 1, the capacitor 10 may be connected to a battery to convert direct current into alternating current, the first housing 20 may have the inner space 21 in which the capacitor 10 can be centrally coupled thereto, and the inner space 21 may be formed to correspond to the size of the capacitor 10.

In one embodiment of the present disclosure, the capacitor 10 may be formed in a rectangular parallelepiped, and the inner space 21 may be formed in a rectangular parallelepiped to correspond to the capacitor 10.

The cooling parts 22 may be separated from the inner space 21 and be recessed inwards from parallel surfaces among the outer side surfaces of the first housing 20 to cool the capacitor 10, and heat may be transferred through the first housing 20 to cool the capacitor 10 without direct contact between the capacitor 10 and a refrigerant. In addition, the cooling channels 23, separated from the inner space 21 and formed such that the opposite cooling parts 22 communicate with each other to allow a refrigerant to flow, may be provided on the opposite sides of the inner space 21 so that a refrigerant in the opposite cooling parts 22 can be circulated. In addition, the through-hole 24 connected to each of the cooling channels 23 such that a refrigerant is introduced from the outside or discharged to the outside may be formed through the housing, and may be formed at each of the cooling channels 23. Accordingly, a refrigerant introduced through the through-hole 24 at one side may circulate through both the cooling parts 22 and the cooling channels 23 to be discharged through the through-hole 24 at the other side.

That is, the first housing 20 may include the cooling parts 21 and the cooling channels 23, which are arranged in a vertical direction to each other.

The cooling parts 22 and the cooling channels 23 may be processed from the outside by using a tool such as a drill such that the same communicate with each other, and the processed portion may be sealed by a taper (T).

The cooling plate 30 may be coupled to the cooling part 22 to seal the same so as to prevent a refrigerant in the cooling part 22 from being discharged to the outside, and a power module 200 may be bonded to the outer side of the cooling plate 30, so that the power module 200 can be cooled by heat transfer through a refrigerant.

Accordingly, the opposite sides of the capacitor 10 can be cooled, and the power module 200 in surface contact with the capacitor module 100 can be cooled at the same time.

The inner space 21 of the first housing 20 may have an open upper portion, so that the capacitor 10 may be inserted through the upper portion of the first housing 20 to be disposed in the inner space 21.

The inner space 21 may have an open upper portion, and the capacitor 10 may be moved downwards to be inserted into the inner space 21.

Accordingly, the capacitor 10 and the first housing 20 can be simply coupled to each other.

The capacitor 10 may include electrodes 11 extending upwards and formed to be electrically connectable.

The open upper portion of the inner space 21 may allow the electrodes 11 of the capacitor 10 to extend upwards and to connect a positive DC busbar 400 (shown in FIG. 7) and a negative DC busbar 500 (shown in FIG. 7) to be positioned on the first housing 20 afterwards.

Accordingly, the first housing 20 may not need to include a separate space required for the electrodes 11 to extend.

The cooling plate 30 may include one or more cooling fins 31 extending into the cooling part 22 to be in contact with a refrigerant.

The cooling plate 30 provided with the cooling fins 31 extending toward the cooling part 22 may increase a contact area with a refrigerant flowing into the cooling part 22.

Accordingly, heat transfer efficiency through a refrigerant can be improved and efficiency for cooling the power module 200 can be improved.

The capacitor module 100 may further include a nipple 40 connected to the through-hole 24 and extending to the outside of the first housing 20 such that a refrigerant is introduced from the outside or discharged to the outside.

The nipple 40 inserted into each of the opposite through-holes 24 to be coupled to the first housing 20 may have a tubular shape and have one side inserted into the through-hole 24 and the other side protruding to the outside of the first housing 20 to be connected to the outside.

One side and the other side of the nipple 40 are formed in the form of a hollow tube, and the nipple 40 has a middle portion connecting one side and the other side thereof and formed in the form of a corrugated tube made of a material having elasticity, so that the middle portion can relieve the impact during the connection to the outside and thus can prevent fracture of the nipple 40.

Figure 5:
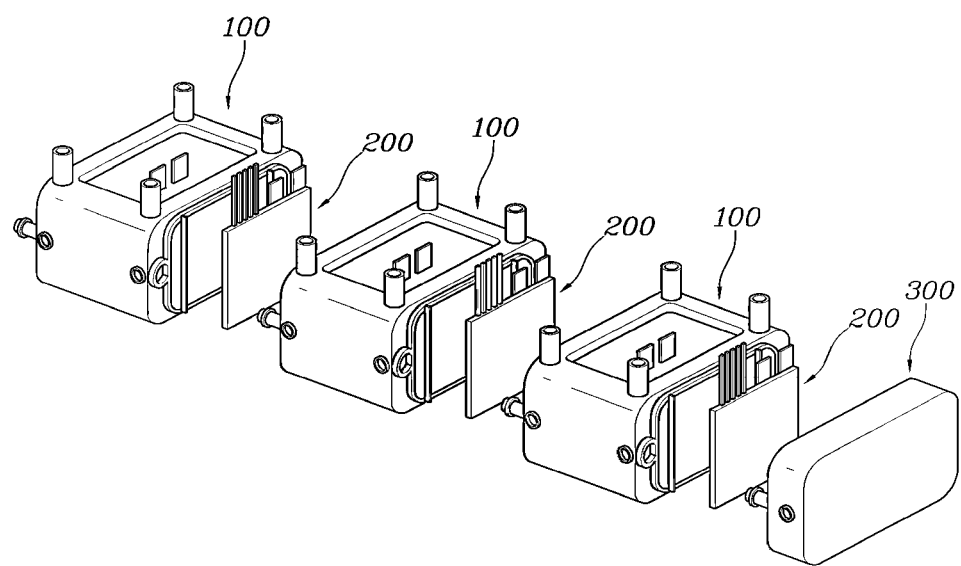
FIG. 5 is a perspective view of a capacitor module, a power module, and a dummy module in a power conversion device according to one embodiment of the present disclosure.
Figure 6:
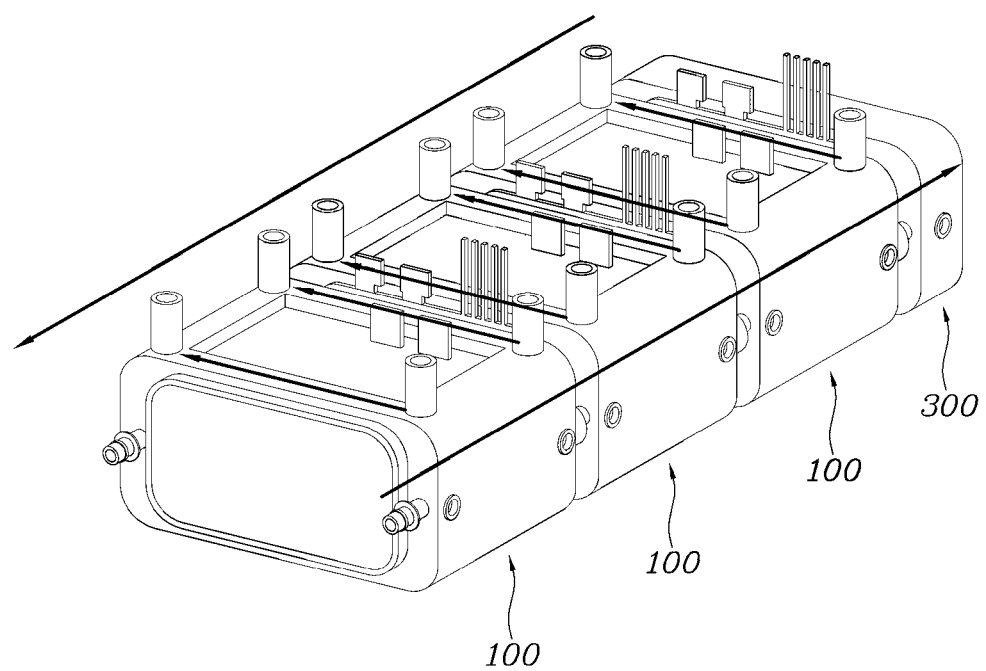
FIG. 6 illustrates a flow of cooling water in a power conversion device according to the present disclosure.
Figure 7:
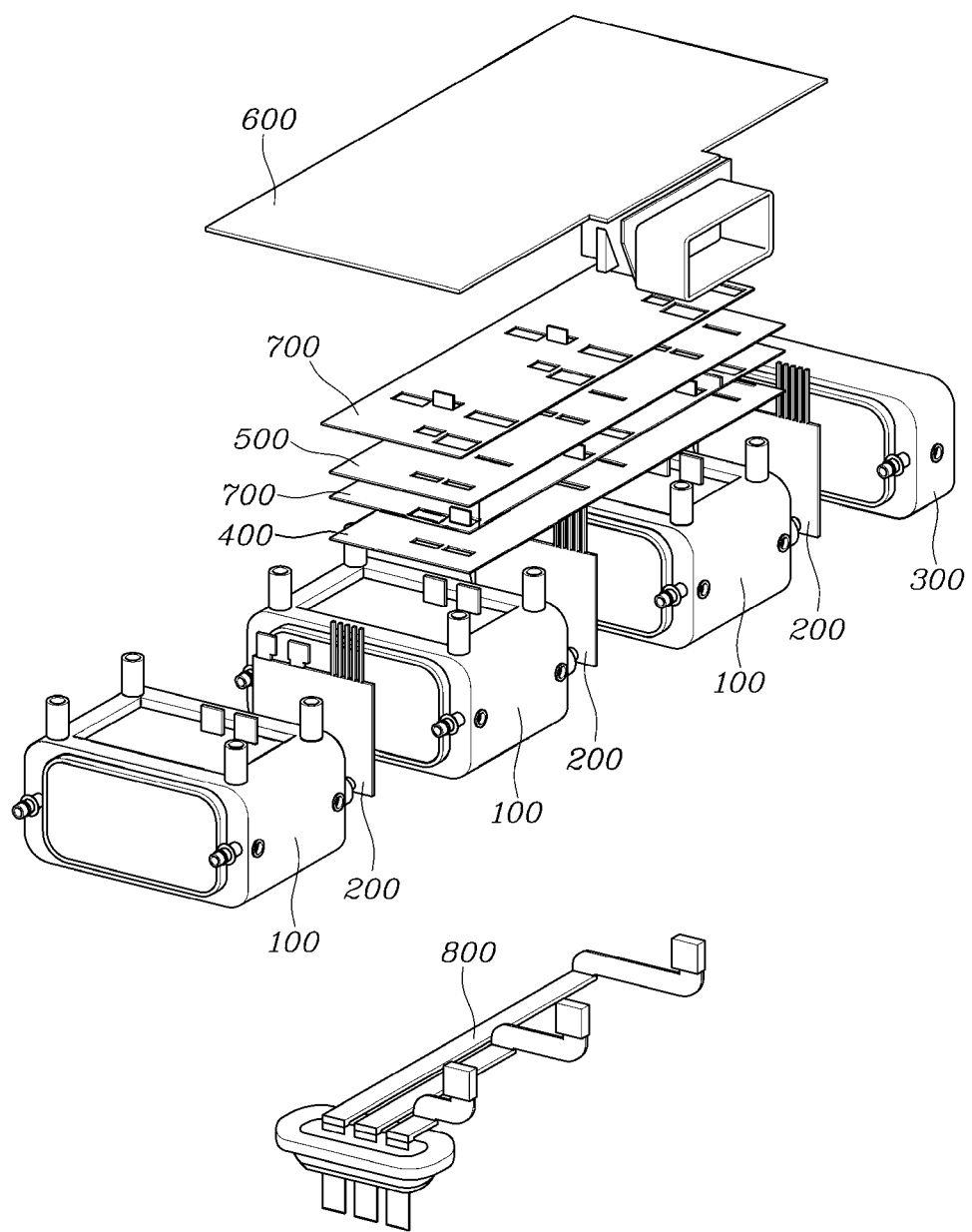
FIG. 7 is a perspective view of a power conversion device according to one embodiment of the present disclosure.

FIG. 5 is a perspective view of the capacitor module 100, the power module 200, and the dummy module 300 in a power conversion device according to one embodiment of the present disclosure, FIG. 6 illustrates a flow of cooling water in a power conversion device according to the present disclosure, and FIG. 7 is a perspective view of a power conversion device according to one embodiment of the present disclosure.

A power conversion device according to the present disclosure will be described with reference to FIGS. 5 to 7 and the other figures described above.

A power conversion device according to the present disclosure includes a capacitor module 100 and a power module 200. The capacitor module 100 includes: a capacitor 10; a first housing 20 having a hexahedron shape and having an inner space 21 into which the capacitor is inserted, the first housing 20 including a pair of cooling parts 22 recessed inwards from a pair of parallel surfaces among the outer side surfaces thereof such that a refrigerant flows, a pair of cooling channels 23 formed inside opposite side surfaces perpendicular to the surfaces of the pair of cooling parts 22 such that the pair of cooling parts 22 communicate with each other, and a through-hole 24 configured to connect the cooling channels 23 to the outside such that a refrigerant is introduced or discharged therethrough; and a cooling plate 30 coupled to the first housing 20 so as to seal the cooling parts 22. The power module 200 has one side surface in surface contact with the cooling plate 30.

As shown in FIG. 5, the power conversion device according to the present disclosure may include the capacitor module 100 and the power module 200 in surface contact with the cooling plate 30 of the capacitor module 100.

Due to the surface contact between the power module 200 and the cooling plate 30, the capacitor module 100 and the power module 200 can be simultaneously cooled through a refrigerant injected into the first housing 20.

The power module 200 may be connected to the capacitor module 100 and be connected to a motor, so that DC current of a battery can be converted into AC current by the capacitor and the converted AC current can be input to the motor.

At this time, the power module 200 may generate heat, and the cooling plate 30 may cool the power module 200, thereby improving working efficiency of the power module 200 and extending the life of thereof. In addition, no additional device through which separate cooling water is injected is required to cool the power module 200, thereby achieving cost reduction.

The capacitor module 100 may include a bracket 50 configured to couple the power module 200 to one side surface thereof such that the same is in contact with the cooling plate.

The bracket 50 may be mounted on the one side surface where the cooling plate 30 is coupled to the first housing 20, such that the power module 200 is coupled to the cooling plate 30 coupled to the first housing 20, so that the power module 200 can be coupled to the bracket 50 to be in contact with the cooling plate 30.

Accordingly, the power module 200 can be fixed to the cooling plate, and the power module 200 may not be separated from the cooling plate 30 even by an external impact.

The power conversion device may further include a dummy module 300 including: a second housing 310 having a cooling part 311 recessed inwards from one side surface thereof such that a refrigerant flows, and a through-hole 312 configured to connect the cooling part 311 to the outside such that a refrigerant is introduced or discharged therethrough; and a cooling plate 320 configured to seal the cooling part 311. The dummy module 300 may be connected such that such that the cooling plate 320 is in surface contact with the other side surface of the power module 200.

The dummy module 300 may have a shape of the capacitor module 100 from which the capacitor 10 and the inner space 21 are removed, and may be disposed such that the cooling plate 320 of the dummy module 300 is in surface contact with the power module 200 in order to cool the other side surface of the power module 200 having one side surface in surface contact with the cooling plate 320. Accordingly, the opposite side surfaces of the power module 200 may be cooled, thereby improving cooling efficiency.

The dummy module 300 may include a nipple 330 connected to the through-hole 312, and the nipple 330 may be connected to the through-hole 24 of the first housing 20 adjacent thereto such that a refrigerant is introduce or discharged through the through-hole 24 of the first housing 20.

In order to couple the capacitor module 100 to the dummy module 300, one side of the nipple 330 may be inserted into the through-hole 312 of the dummy module 300 and the other end thereof may be inserted into the through-hole 24 of the capacitor module 100 so that the cooling channel 23 of the capacitor module 100 may be connected to the cooling part 311 of the dummy module 300.

Accordingly, as shown in FIG. 6, a refrigerant introduced through the through-hole 24 of the capacitor module 100 may circulate through the cooling part 22 and the cooling channel 23 of the capacitor module 100 and the cooling part 311 of the dummy module 300 to exchange heat with the cooling plate 320, and then may be discharged through the through-hole 24 of the capacitor module 100. Therefore, a refrigerant can exchange heat with all the cooling plates 30 and 320 through a single inflow and outflow thereof.

The plurality of capacitor modules 100 and power modules 200 may be alternately stacked to each other in a coupling direction thereof.

As shown in FIG. 5, the capacitor modules 100 and the power modules 200 may be alternately stacked to each other so that the opposite side surfaces of the power module 200 are in contact with the cooling plates 30 and 320.

Accordingly, the opposite side surfaces of the power module 200 may be cooled, and the plurality of capacitor modules 100 and power module 200 may be connected to each other.

The through-hole 24 may be formed through the outer side surface of the first housing 20 in a direction in which the cooling channel 23 extends, the capacitor module 100 may further include the nipple 40 which is connected to the through-hole 24 and through which a refrigerant is injected, and the nipple 40 may be configured to connect the through-holes 24 of the two adjacent capacitor modules 100.

The through-holes 24 of the capacitor module may be located on the opposite side surfaces of the capacitor module in a direction in which the cooling channel 23 extends, the nipple 40 may be inserted into each of the through-holes 24 formed through one side surface to which the cooling plate 30 is coupled, and the nipple 40 may connect the through-holes 24 of the two adjacent capacitor modules 100 to connect the plurality of capacitor modules 100 to each other. The nipple 40 may connect the respective cooling channels 23 to allow a refrigerant to be injected into all the capacitor modules 100 when the refrigerant is introduced through the nipple 40 connected to the outside, and the refrigerant having circulated through the capacitor modules 100 may be discharged through the nipple 40 connected to the outside.

The power conversion device may further include: a positive DC busbar 400 positioned on the capacitor module 100 and the power module 200 and configured to connect positive electrodes of the capacitor module 100 and the power module 200 to a positive electrode of a battery; a negative DC busbar 500 stacked on a first insulation plate 700 and configured to connect negative electrodes of the capacitor module 100 and the power module 200 to a negative electrode of the battery; a control board 600 positioned on the negative DC busbar 500 and connected to the power module 200 to control the power module 200; and insulation plates 700 positioned on the positive DC busbar 400 and the negative DC busbar 500, respectively, to insulate the same from each other.

The negative DC busbar configured to connect negative electrodes of the capacitor module 100 and the power module 200 may be provided on the capacitor module 100 and the power module 200, and a positive DC busbar 400 configured to connect positive electrodes of the capacitor module 100 and the power module 200 may be provided beneath the negative DC busbar 500, thereby connecting the capacitor module 100 and the power module 200 to each other, and the pair of insulation plates 700 may be provided on the negative DC busbar 500 and under the positive DC busbar 400, respectively, to insulate the same from each other.

The control board 600 connected to the power module 200 to control the operation of the power module 200 may be disposed on the positive DC busbar.

The power conversion device may further include a busbar assembly 800 connected to the bottom of the power module 200 to connect an external motor to the power module 200.

The power modules 200 may be connected to a motor by the busbar assembly 800, and the busbar assembly 800 may extend downward from the power module 200 to be connected to a motor positioned below the busbar assembly 800, thereby transmitting current to the motor. In addition, when the plurality of power modules 200 are provided, the busbar assembly 800 may be connected to the plurality of power modules 200 to connect the same to the motor.

The motor may be provided as a three-phase module, and the power module 200 may be connected to each phase.

Figure 8:
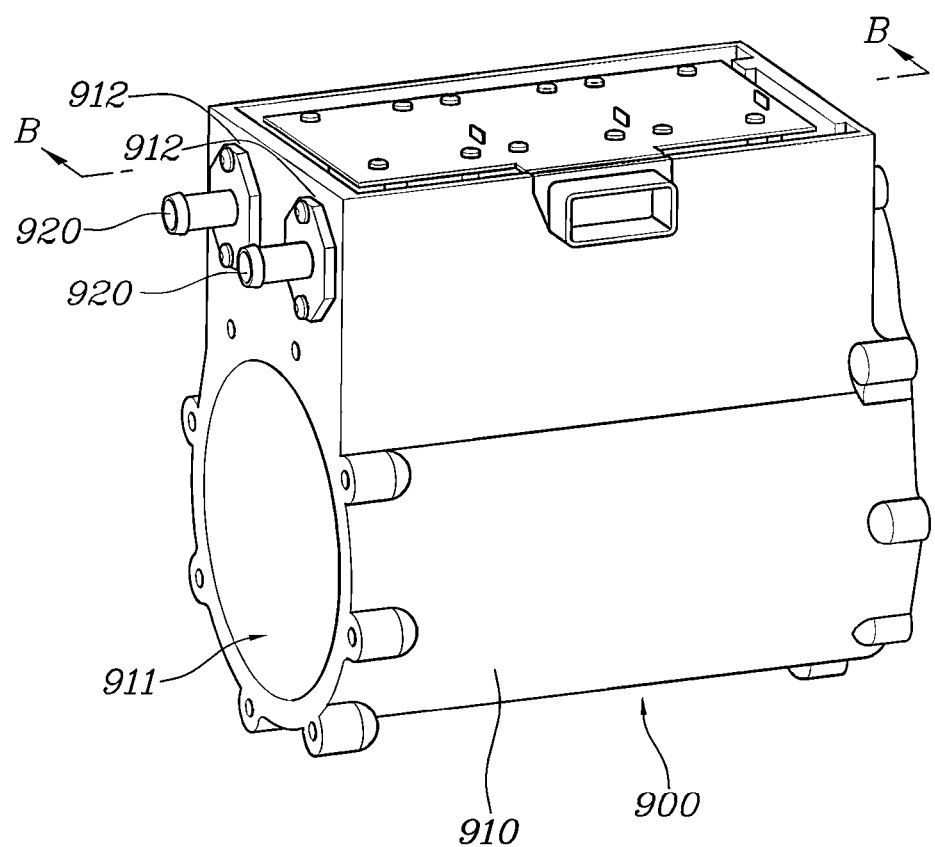
FIG. 8 is a perspective view of a motor assembly according to one embodiment of the present disclosure.
Figure 9:
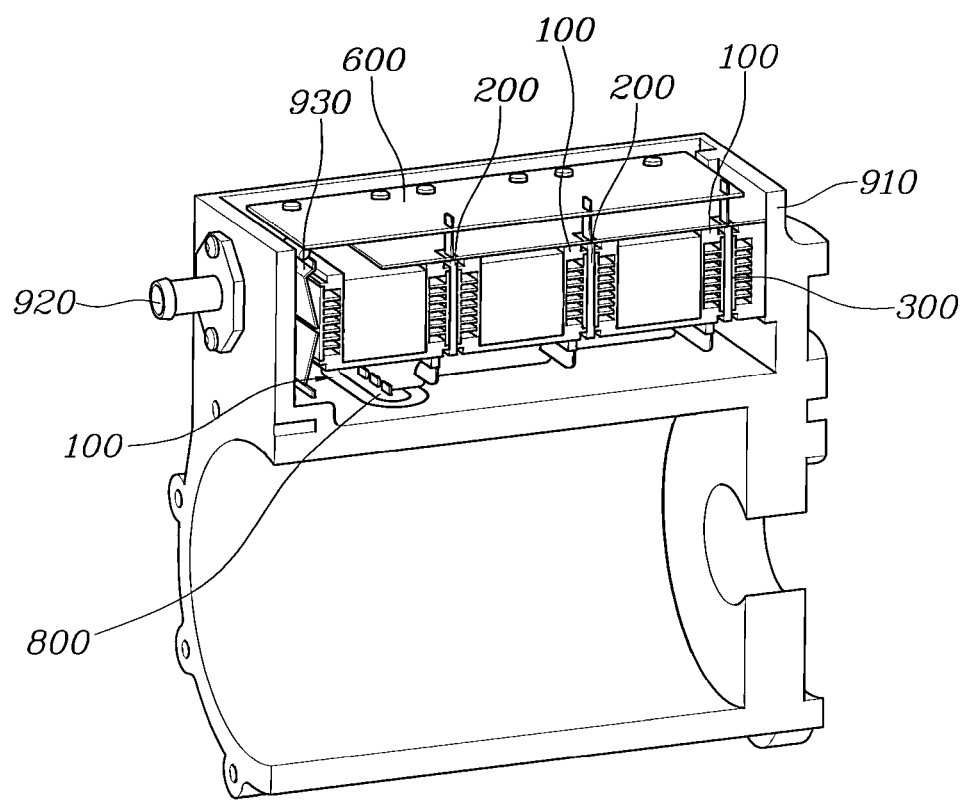
FIG. 9 is a cross-sectional view taken along line B-B of FIG. 8.

FIG. 8 is a perspective view of a motor assembly according to one embodiment of the present disclosure, and FIG. 9 is a cross-sectional view taken along line B-B of FIG. 8.

A preferred embodiment of the motor assembly 900 according to the present disclosure will be described with reference to FIGS. 8 and 9.

The motor assembly 900 according to the present disclosure includes a motor housing 910 including: a first mounting part 911 which is formed at the lower portion thereof and in which a motor is disposed; and a second mounting part 912 which is formed at the upper portion thereof and in which a power conversion device is disposed.

The second mounting part 912 may have an open upper side to allow the power conversion device to be inserted downwards, the first mounting part 911 separated from the second mounting part 912 may be formed at the lower portion of the motor housing 910 to allow a motor to be disposed therein, and the busbar assembly 800 may extend downwards to connect the power module 200 to the motor.

The motor assembly may further include a connector 920 formed through the motor housing 910 toward the second mounting part 912 and connected to the through-hole 24 of the first housing 20 such that a refrigerant is injected from the outside.

The connector 920 may be connected to each of the pair of nipples 40 of the capacitor module 100 inserted into the second mounting part 912 such that a refrigerant is introduced or discharged therethrough.

The motor housing 910 may have an open upper side to allow a vehicle power conversion device to be inserted into the second mounting part 912 from above, and may further include a support part 930 disposed inside the second mounting part 912 and configured to support the power conversion device inserted into the second mounting part 912.

The support part 930 may be provided on one side of the second mounting part 912 to fixedly press the power conversion device in a direction in which a refrigerant is injected, such that the power conversion device inserted into the second mounting part 912 is immovable inside the second mounting part 912.

The support part 930 may be in the form of a plate spring protruding in a first direction, so that the power conversion device can be conveniently inserted into the second mounting part 912 or detached from the second mounting part 912 to the outside.

Although the present disclosure has been described and illustrated in conjunction with particular embodiments thereof, it will be apparent to those skilled in the art that various improvements and modifications may be made to the present disclosure without departing from the technical idea of the present disclosure defined by the appended claims.

What is claimed is:

1. A capacitor module comprising:
a capacitor;
a first housing having an inner space in which the capacitor is disposed, the first housing comprising a pair of cooling parts recessed inwards from a pair of parallel surfaces among outer side surfaces thereof such that a refrigerant flows, a pair of cooling channels disposed inside opposite side surfaces perpendicular to the surfaces of the pair of cooling parts such that the pair of cooling parts communicate with each other, and a through-hole configured to connect each of the cooling channels to the outside such that the refrigerant is introduced or discharged therethrough; and
a pair of cooling plates coupled to the first housing so as to seal the cooling parts.

2. The capacitor module of claim 1, wherein the inner space of the first housing has an open upper portion configured to allow the capacitor to be inserted through the upper portion of the first housing to the inner space.

3. The capacitor module of claim 2, wherein the capacitor comprises electrodes extending upwards and configured to be electrically connectable.

4. The capacitor module of claim 1, wherein the cooling plates comprise one or more cooling fins extending into the cooling parts to be in contact with the refrigerant.

5. The capacitor module of claim 1, further comprising a nipple connected to the through-hole and extending to the outside of the first housing such that the refrigerant is introduced from the outside or discharged to the outside.

6. The capacitor module of claim 1, wherein the first housing has a hexahedron shape.

* * * * *